US011860200B2

(12) United States Patent
Li (10) Patent No.: US 11,860,200 B2
(45) Date of Patent: Jan. 2, 2024

(54) ZERO CROSSING POINT SIGNAL OUTPUT AND POWER LINE DATA TRANSMITTING METHOD AND DEVICE

(71) Applicant: TENDYRON CORPORATION, Beijing (CN)

(72) Inventor: Dongsheng Li, Beijing (CN)

(73) Assignee: TENDYRON CORPORATION, Beijing (CN)

( * ) Notice: Subject to any disclaimer, the term of this patent is extended or adjusted under 35 U.S.C. 154(b) by 242 days.

(21) Appl. No.: 17/644,842

(22) Filed: Dec. 17, 2021

(65) Prior Publication Data
US 2022/0113338 A1 Apr. 14, 2022

Related U.S. Application Data

(63) Continuation of application No. PCT/CN2020/093221, filed on May 29, 2020.

(30) Foreign Application Priority Data

Jun. 24, 2019 (CN) .......................... 201910547336.2

(51) Int. Cl.
*G01R 19/175* (2006.01)
*G01R 19/25* (2006.01)
*H04B 3/54* (2006.01)

(52) U.S. Cl.
CPC ....... *G01R 19/175* (2013.01); *G01R 19/2513* (2013.01); *H04B 3/546* (2013.01); *H04B 3/548* (2013.01)

(58) Field of Classification Search
None
See application file for complete search history.

(56) References Cited

U.S. PATENT DOCUMENTS 7,233,635 B2 * 6/2007 Lee ........................ H04L 7/0054
375/354
11,356,143 B2 * 6/2022 Bennett .................... H04B 3/54

FOREIGN PATENT DOCUMENTS

CN 101871965 10/2010
CN 102033161 4/2011
(Continued)

OTHER PUBLICATIONS

International Search Report from corresponding PCT Appln. No. PCT/CN2020/093221, dated Aug. 18, 2020.
(Continued)

*Primary Examiner* — Thomas J. Hiltunen
*Assistant Examiner* — Khareem E Almo
(74) *Attorney, Agent, or Firm* — Grossman, Tucker, Perreault & Pfleger, PLLC (57) ABSTRACT

Provided is a zero crossing point signal output method, including: continuously receiving zero crossing point square wave signals, and periodically sampling zero crossing point square wave signals at a predetermined sampling frequency; acquiring sampling numbers of $1^{st}$ to $M^{th}$ zero crossing point square wave signals to obtain an average sampling number S, and calculating a first zero crossing point interval T1; setting a zero crossing point signal output interval as the first zero crossing point interval T1; continuously outputting zero crossing point signals with an interval being the zero crossing point signal output interval; obtaining sampling numbers of $M+1^{th}$ to $M+N^{th}$ zero crossing point square wave signals, calculating a difference value between each of the sampling numbers and S, and obtaining an accumulated difference value Δs through calculation; when Δs is not within a predetermined change range, obtaining a second zero crossing point interval T2 and setting the zero crossing point signal output interval as T2; and when Δs is within the (Continued)

predetermined change range, keeping the zero crossing point signal output interval unchanged.

10 Claims, 4 Drawing Sheets

(56) References Cited

FOREIGN PATENT DOCUMENTS

| | | |
|---|---|---|
| CN | 102116798 | 7/2011 |
| CN | 104320239 | 1/2015 |
| CN | 104767549 | 7/2015 |
| CN | 105277780 | 1/2016 |
| CN | 105675953 | 6/2016 |
| CN | 106018958 | 10/2016 |
| CN | 106059623 | 10/2016 |
| CN | 107656132 | 2/2018 |
| CN | 109782207 | 5/2019 |
| JP | 10185966 | 7/1998 |
| KR | 20020064512 | 8/2002 |
| WO | 2014113400 A1 | 7/2014 |
| WO | 2016161573 | 10/2016 |

OTHER PUBLICATIONS

Office Action from related Chinese Appln. No. 201910547336.2 dated Apr. 6, 2021 English translation attached.
Notice of Allowance from related Chinese Application No. 201910547336.2 dated Aug. 18, 2021. English translation attached.
Extended European Search Report from related Application No. 20831511.9 dated Jun. 13, 2023 (7 pages).

\* cited by examiner

FIG. 7

ZERO CROSSING POINT SIGNAL OUTPUT AND POWER LINE DATA TRANSMITTING METHOD AND DEVICE

CROSS-REFERENCE TO RELATED APPLICATIONS

The present application is a continuation of International Application No. PCT/CN2020/093221, filed on May 29, 2020, which claims priority to Chinese Patent Application No. 201910547336.2, titled "ZERO CROSSING POINT SIGNAL OUTPUT AND POWER LINE DATA TRANSMITTING METHOD AND DEVICE", filed on Jun. 24, 2019 by TENDYRON CORPORATION, the entire contents of which are incorporated herein by reference.

FIELD

The present disclosure relates to the field of electronic technology, and more particularly, to a zero crossing point signal output method and apparatus and a power line data transmitting method and device.

BACKGROUND

With the development of electronic technology and network technology, the use of power lines as a carrier for signal transmission has attracted more and more attention. Among them, low-voltage power line carrier communication (PLC) technology uses existing low-voltage power supply lines to realize data transmission, and has advantages of requiring no rewiring, saving system construction costs, and strong practicability. It is widely used in automatic meter reading, lighting control, smart community, smart building, home network, home smart control, home security, etc.

Due to the characteristics of commercial power or mains power (50 HZ/60 HZ) transmitted by a power line, there will be a certain frequency (100 HZ/120 HZ) of pulse interference on the power line. The use of zero-crossing transmission on the power line can avoid the pulse interference from the mains power. The zero-crossing transmission refers to making use of the short time when the mains power crosses the zero point, that is, the neighborhood of the zero point, to transmit a signal. However, because the periodicity of the mains power itself and the detection of zero crossing points of the mains power have certain errors, it is difficult to control synchronization between the signal transmission and the alternating current (AC) waveform in practical applications. Therefore, how to obtain accurate zero crossing point time and conduct a reliable transmission of information between various devices in the power line communication system based on the zero crossing point time to ensure that the transmitted data is accurately identified is an urgent technical problem that needs to be resolved in the technical field.

SUMMARY

The present disclosure is directed to solving the above problems.

In order to achieve the purpose, the technical solution of the present disclosure is implemented as follows.

The present disclosure mainly aims to provide a zero crossing point signal output method including: continuously receiving zero crossing point square wave signals input by a zero-crossing detection circuit, and periodically sampling each zero crossing point square wave signal at a predetermined sampling frequency; acquiring a sampling number of each zero crossing point square wave signal in $1^{st}$ $M^{th}$ zero crossing point square wave signals to obtain sampling numbers of M zero crossing point square wave signals, calculating an average value of the sampling numbers of the M zero crossing point square wave signals to obtain an average sampling number S, and calculating a first zero crossing point interval T1 based on the average sampling number S and the predetermined sampling frequency; and setting a zero crossing point signal output interval as the first zero crossing point interval T1, where M is a predetermined value and is a positive integer greater than or equal to 1; continuously outputting zero crossing point signals with an interval being the zero crossing point signal output interval; obtaining a sampling number of each zero crossing point square wave signal in $M+1^{th}$ to $M+N^{th}$ zero crossing point square wave signals to obtain sampling numbers of N zero crossing point square wave signals, calculating a difference value between each of the sampling numbers of the N zero crossing point square wave signals and the average sampling number S to obtain N sampling number difference values, and summing the N sampling number difference values to obtain an accumulated difference value $\Delta s$, where N is a predetermined value and is a positive integer greater than or equal to 1; calculating, when $\Delta s$ is not within a predetermined change range, a second zero crossing point interval T2 in accordance with a predetermined rule, and setting the zero crossing point signal output interval as the second zero crossing point interval T2; and when $\Delta s$ is within the predetermined change range, keeping the zero crossing point signal output interval unchanged; and continuously outputting zero crossing point signals with an interval being the zero crossing point signal output interval.

Another object of the present disclosure is to provide a computer-readable storage medium including computer instructions. The computer instructions, when executed, implement the zero crossing point signal output method as described above.

Another object of the present disclosure is to provide a power line data transmitting method including the zero crossing point signal output method as described above, and further including: subsequent to said continuously outputting the zero crossing point signals with the interval being the zero crossing point signal output interval T, determining a $1^{st}$ zero crossing point time t based on the zero crossing point signals, and determining a start time of transmitting a synchronization signal of a data packet to be transmitted based on the $1^{st}$ zero crossing point time, wherein the start time of transmitting the synchronization signal of the data packet to be transmitted is $t+t_1$, $t+t_1$ is earlier than a $2^{nd}$ zero crossing point time $t+T$, $t+T$ is contained in a time period from a time point of transmitting a first synchronization bit signal to a time point of transmitting a last synchronization bit signal, and $t_1$ is a first predetermined fixed value; and sequentially transmitting data bit signals of the data packet to be transmitted.

Another object of the present disclosure is to provide a computer-readable storage medium including computer instructions. The computer instructions, when executed, implement the power line data transmitting method as described above.

Another object of the present disclosure is to provide a zero crossing point signal output apparatus, including a receiving module, a sampling module, a calculating module and an outputting module. The receiving module is configured to continuously receive zero crossing point square wave signals input by a zero-crossing detection circuit. The sampling module is configured to periodically sample each zero crossing point square wave signal at a predetermined sampling frequency. The calculating module is configured to acquire a sampling number of each zero crossing point square wave signal in $1^{st}$ to $M^{th}$ zero crossing point square wave signals to obtain sampling numbers of M zero crossing point square wave signals, calculate an average value of the sampling numbers of the M zero crossing point square wave signals to obtain an average sampling number S, and calculate a first zero crossing point interval T1 based on the average sampling number S and the predetermined sampling frequency; and set a zero crossing point signal output interval as the first zero crossing point interval T1, wherein M is a predetermined value and is a positive integer greater than or equal to 1. The outputting module is configured to continuously output zero crossing point signals with an interval being the zero crossing point signal output interval. The calculating module is further configured to obtain a sampling number of each zero crossing point square wave signal in $M+1^{th}$ to $M+N^{th}$ zero crossing point square wave signals to obtain sampling numbers of N zero crossing point square wave signals, calculate a difference value between each of the sampling numbers of the N zero crossing point square wave signals and the average sampling number S to obtain N sampling number difference values, and sum the N sampling number difference values to obtain an accumulated difference value Δs, where N is a predetermined value and is a positive integer greater than or equal to 1; calculate, when Δs is not within a predetermined change range, a second zero crossing point interval T2 in accordance with a predetermined rule, and set the zero crossing point signal output interval as the second zero crossing point interval T2; and when Δs is within the predetermined change range, keep the zero crossing point signal output interval unchanged.

Another object of the present disclosure is to provide a power line data transmitting device, including the zero crossing point signal output apparatus as described above, and a data outputting module. The data outputting module is configured to, subsequent to receiving the zero crossing point signals with the interval being the zero crossing point signal output interval which are continuously output by the outputting module, determine a 1st zero crossing point time t based on the zero crossing point signals, and determine a start time of transmitting a synchronization signal of a data packet to be transmitted based on the 1st zero crossing point time, wherein the start time of transmitting the synchronization signal of the data packet to be transmitted is $t+t_1$, $t+t_1$ is earlier than a 2nd zero crossing point time t+T, t+T is included in a time period from a time point of transmitting a first synchronization bit signal to a time point of transmitting a last synchronization bit signal, and $t_1$ is a first predetermined fixed value; and sequentially transmit data bit signals of the data packet to be transmitted.

As can be seen from the technical solution provided by the present disclosure, the embodiments of the present disclosure provide a zero crossing point signal output method and apparatus, and a power line data transmitting method and device. According to the zero crossing point signal output method and apparatus, after receiving zero crossing point square wave signals input by a zero-crossing detection circuit, an average sampling number is obtained by calculating a sampling number of each zero crossing point square wave signal in $1^{st}$ to $M^{th}$ zero crossing point square wave signals, a zero crossing point signal output interval is obtained based on the average sampling number and a predetermined sampling frequency, zero crossing point signals are output based on the zero crossing point signal output interval, sampling numbers of subsequent zero crossing point square wave signals are continuously calculated, the zero crossing point signal output interval is adjusted based on the subsequent zero crossing point square wave signals, and the zero crossing point signals are output based on the adjusted result. By using the zero crossing point signal output method and apparatus to correct a detection result of the zero-crossing detection circuit and output the zero crossing point signals, the zero crossing point signals output according to the method have small errors, and when such zero crossing point signals are used to conduct power line communications, the problem of low zero crossing point communication efficiency due to a large error in the detection result of the zero-crossing detection circuit is avoided, and the communication efficiency is improved. According to the power line data transmitting method and device as described above, after receiving zero crossing point square wave signals input by a zero-crossing detection circuit, an average sampling number is obtained by calculating a sampling number of each zero crossing point square wave signal in $1^{st}$ to $M^{th}$ zero crossing point square wave signals, a zero crossing point signal output interval is obtained based on the average sampling number and a predetermined sampling frequency, zero crossing point signals are output based on the zero crossing point signal output interval, a zero crossing point time is determined based on the zero crossing point signals, a start time of transmitting a synchronization signal of a data packet to be transmitted is determined, such that the zero crossing point time is contained in a time period during which the synchronization signal is transmitted, sampling numbers of subsequent zero crossing point square wave signals are continuously calculated, the zero crossing point signal output interval is adjusted based on the subsequent zero crossing point square wave signals, and the zero crossing point signals are output based on the adjusted result. By using the power line data transmitting method and device as described above to correct a detection result of the zero-crossing detection circuit and output the zero crossing point signals, when the zero crossing point signals are used to conduct power line communications, the problem of low zero crossing point communication efficiency due to a large error in the detection result of the zero-crossing detection circuit is avoided, and the communication efficiency is improved. Meanwhile, the zero crossing point signal is contained in the time period for transmitting the synchronization signal of the data packet to be transmitted, so that a receiving end can determine whether received signals are near a zero crossing point and determine whether the signals are the synchronization signal, and thus information can be transmitted efficiently and completely.

BRIEF DESCRIPTION OF DRAWINGS

In order to clearly illustrate technical solutions of embodiments of the present disclosure, a brief description of drawings used in the description of the embodiments is given below. Obviously, the drawings in the following descriptions are only some embodiments of the present disclosure, and for those skilled in the art, other drawings can be obtained according to these drawings without creative labor.

DETAILED DESCRIPTION

Description will be made clearly and completely of technical solutions in the embodiments of the present disclosure in conjunction with accompanying drawings in the embodiments of the present disclosure. Obviously, the embodiments described here are only part of the embodiments of the present disclosure and are not all embodiments of the present disclosure. Based on the embodiments of the present disclosure, all other embodiments obtained by those skilled in the art without creative labor are within the protection scope of the present disclosure.

Embodiment 1

Figure 1:
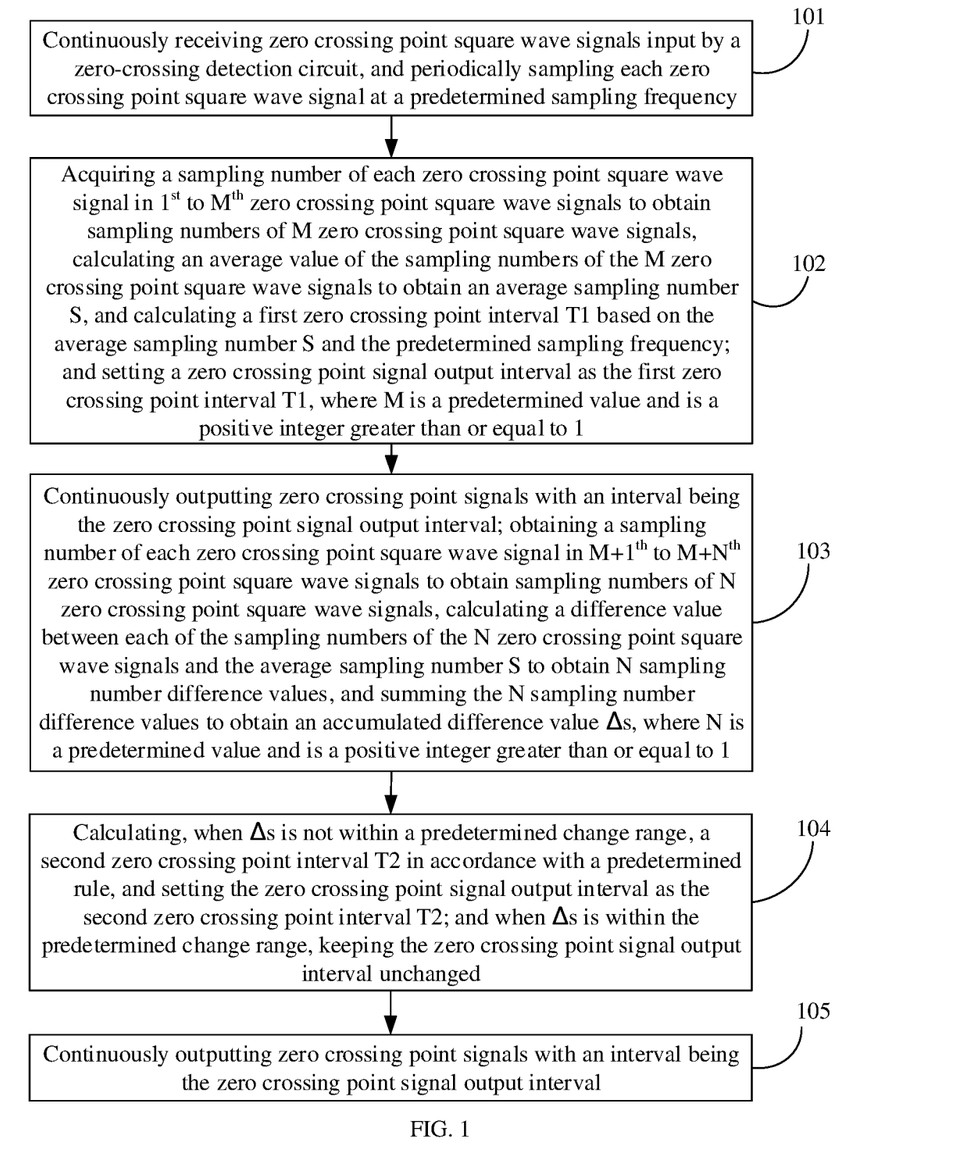
FIG. 1 is a flowchart of a zero crossing point signal output method according to Embodiment 1 of the present disclosure.

As illustrated in FIG. 1, the embodiment provides a zero crossing point signal output method. To achieve the above object, the technical solution of the present disclosure is specifically implemented as follows.

At S101, zero crossing point square wave signals input by a zero-crossing detection circuit are continuously received, and each zero crossing point square wave signal is periodically sampled at a predetermined sampling frequency.

Figure 2:
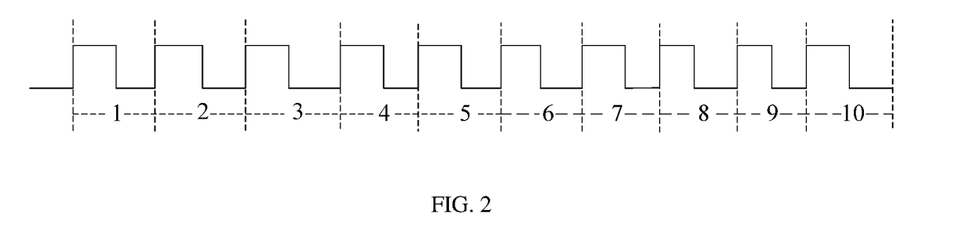
FIG. 2 is a schematic diagram of zero crossing point square wave signals input by a zero-crossing detection circuit according to Embodiment 1 of the present disclosure.

In the embodiment, since a power system may typically provide a power frequency voltage of 50 HZ, that is, a power frequency voltage with a periodicity of 20 ms, for alternating current power, there are two moments in each alternating current periodicity at which the voltage value is zero, that is, two zero crossing points. However, the periodicity of the mains power supply generally has an error of about 1%-2%. Thus, when the zero crossing points are used for power line carrier communications, the periodicity and the zero crossing points cannot be determined directly by using the nominal mains frequency 50 HZ. Instead, the actual periodicity and zero crossing points need to be obtained again through detection and calculation, and then the actual periodicity and zero crossing points are used to conduct power line carrier communications. However, since the zero-crossing detection circuit generally includes analog devices, there is large error in detection of zero crossing points, and the zero crossing point square wave signals output by the zero-crossing detection circuit also have large errors. For example, for the zero crossing point square wave signals output by the zero-crossing detection circuit as illustrated in FIG. 2, the periodicity of the zero crossing point square wave signals varies significantly. Hereinafter, the solution of the embodiment will be described by taking the received zero crossing point square wave signals being the zero crossing point square wave signals shown in FIG. 2 as an example.

In the embodiment, each zero crossing point square wave signal is periodically sampled at a predetermined sampling frequency, that is, each zero crossing point square wave signal is sampled by using a high-speed clock. For example, the predetermined sampling frequency may be set to 2000 HZ. Taking the mains frequency being 50 HZ as an example, the sampling number of the zero crossing point square wave signal is usually about 40. By periodically sampling each zero crossing point square wave signal, the periodicity of each zero crossing point square wave signal can be obtained, and the next calculation is further executed.

In an optional implementation of the embodiment, after the zero crossing point square wave signals input by the zero-crossing detection circuit are continuously received, filtering is performed on each of the received zero crossing point square wave signals to filter out high-frequency noise in each zero crossing point square wave signal, and then each zero crossing point square wave signal is periodically sampled at the predetermined sampling frequency. In the optional implementation, the zero crossing point square wave signals are periodically sampled after the high-frequency noise is filtered out, so that misjudgment of the zero crossing point square wave signals caused by the existence of the high-frequency noise and hence incorrect sampling results due to the misjudgment are avoided.

At S102, a sampling number of each zero crossing point square wave signal in $1^{st}$ to $M^{th}$ zero crossing point square wave signals is acquired to obtain sampling numbers of M zero crossing point square wave signals, an average value of the sampling numbers of the M zero crossing point square wave signals is calculated to obtain an average sampling number S, and a first zero crossing point interval T1 is calculated based on the average sampling number S and the predetermined sampling frequency; and a zero crossing point signal output interval is set as the first zero crossing point interval T1, where M is a predetermined value and is a positive integer greater than or equal to 1.

In the embodiment, partial sampling results are obtained by periodically sampling each zero crossing point square wave signal at S101. For example, supposing a predetermined value M=5, the sampling number of each zero crossing point square wave signal in the $1^{st}$ to $5^{th}$ zero crossing point square wave signals is obtained. The sampling numbers of the $1^{st}$ to $5^{th}$ zero crossing point square wave signals are 38, 39, 45, 36, and 37, respectively, and the average value of the sampling numbers of the five zero crossing point square wave signals is calculated to be 39, that is, the average sampling number S=39.

In the embodiment, the first zero crossing point interval T1 is calculated based on the average sampling number S and a predetermined sampling frequency. That is, the average periodicity of the zero crossing point square wave signals is calculated based on the average sampling number S and the predetermined sampling frequency, and then the first zero crossing point interval T1 is obtained based on the average periodicity of the zero crossing point square wave signals. Alternatively, since in alternating current there are 2 zero crossing points in each periodicity of the zero crossing point square wave signals, the interval between zero crossing points should be one half of a periodicity. For example, when the average sampling number S is 39 and the predetermined sampling frequency is 2000 HZ, the average periodicity of the zero crossing point square wave signals is 0.0195 s, that is, the first zero crossing point interval T1 is 0.00975 s, and the zero crossing point signal output interval is set to 0.00975 s. By calculating the average value of the sampling numbers of the M zero crossing point square wave signals and obtaining the first zero crossing point interval by using the average sampling number, the error of the zero crossing point square wave signals output by the zero-crossing detection circuit can be reduced, and more accurate zero crossing point interval can be obtained.

At S103, zero crossing point signals with an interval being the zero crossing point signal output interval are continuously output; a sampling number of each zero crossing point square wave signal in $M+1^{th}$ to $M+N^{th}$ zero crossing point square wave signals is obtained to obtain sampling numbers of N zero crossing point square wave signals, a difference value between each of the sampling numbers of the N zero crossing point square wave signals and the average sampling number S is calculated to obtain N sampling number difference values, and the N sampling number difference values are summed to obtain an accumulated difference value $\Delta s$, where N is a predetermined value and is a positive integer greater than or equal to 1.

Figure 3:
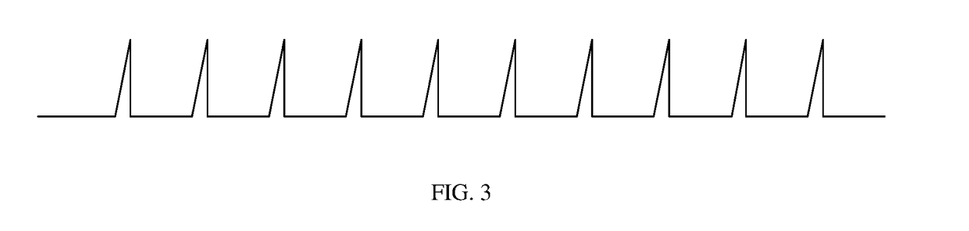
FIG. 3 is a schematic diagram of an output waveform of zero crossing point signals according to Embodiment 1 of the present disclosure.
Figure 4:
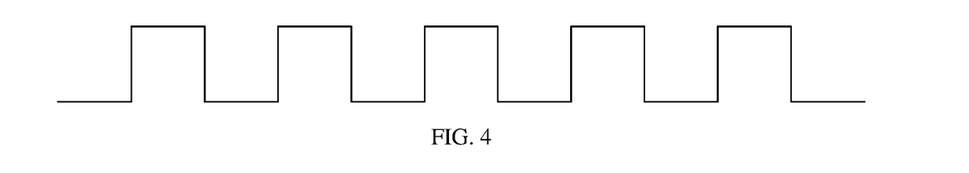
FIG. 4 is a schematic diagram of another output waveform of zero crossing point signals according to Embodiment 1 of the present disclosure.

In the embodiment, the zero crossing point signals may be output in various modes. For example, in a first mode, zero crossing point signals are output as high-frequency pulses. As illustrated in FIG. 3, when the output interval of the zero crossing point signals is 0.00975 s, a high-frequency pulse is output every 0.00975 s, and the time when the high-frequency pulse occurs is the zero crossing point time. In a second mode, the zero crossing point signals are output as alternating high and low levels. As illustrated in FIG. 4, when the output interval of the zero crossing point signals is 0.00975 s, a high-level signal with a duration of 0.00975 s and a low-level signal with a duration of 0.00975 s are alternately output, and the time when the level changes is the zero crossing point time. Zero crossing point signals with an interval being the zero crossing point signal output interval are output, the zero crossing point signals can be used to conduct zero crossing point power line communications, and the problem of inaccurate zero crossing point time and low communication efficiency due to a large error in the detection result of analog devices in the zero-crossing detection circuit can be avoided.

In the embodiment, while using the zero crossing point signal output interval to output the zero crossing point signals, the zero crossing point signal output interval is calculated and corrected by further using a sum of difference values between sampling numbers of a predetermined number of the zero crossing point square wave signals and the average sampling number S. For example, as illustrated in FIG. 2, supposing the predetermined value N=5, the sampling number of each zero crossing point square wave signal of the $6^{th}$ to $10^{th}$ zero crossing point square wave signals is obtained. The sampling numbers of the five zero crossing point square wave signals are 38, 36, 35, 32, and 40, respectively. Thus, the difference value between each of the sampling number 38, 36, 35, 32 and 40 and the average sampling number 39 is calculated to obtain five sampling number difference values as 1, 3, 4, 7, and −1 respectively, and the five sampling number difference values are summed to obtain the accumulated difference value $\Delta s$ as 14.

At S104, when $\Delta s$ is not within a predetermined change range, a second zero crossing point interval T2 is calculated in accordance with a predetermined rule, and the zero crossing point signal output interval is set as the second zero crossing point interval T2; and when $\Delta s$ is within the predetermined change range, the zero crossing point signal output interval is kept unchanged.

In the embodiment, after the accumulated difference value $\Delta s$ is calculated, the zero crossing point signal output interval is adjusted based on $\Delta s$. That is, by determining whether $\Delta s$ is within the predetermined change range, it is determined whether the second zero crossing point interval T2 is calculated in accordance with the predetermined rule. When $\Delta s$ is not within the predetermined change range, the second zero crossing point interval T2 is calculated in accordance with the predetermined rule, and the zero crossing point signal output interval is set as the second zero crossing point interval T2; and when $\Delta s$ is within the predetermined change range, the zero crossing point signal output interval is still T1. By determining whether the accumulated difference value $\Delta s$ is within the predetermined change range to adjust the zero crossing point signal output interval, the zero crossing point signal output interval can be more precise, and the communication efficiency is improved. For example, when the predetermined change range is [−5,5] and $\Delta s=14$ which is not within the predetermined change range, the current zero crossing point signal output interval is considered to be inaccurate and needs to be adjusted, and the second zero crossing point interval T2 is calculated in accordance with the predetermined rule. When $\Delta s=3$ which is within the predetermined change range, the current zero crossing point signal output interval is considered to be accurate without having to be adjusted. Thus, the zero crossing point signal output interval is still T1.

In an optional implementation of the embodiment, $T2=T1-\Delta t$ is calculated when $\Delta s$ is smaller than a minimum value of the predetermined change range, and $T2=T1+\Delta t$ is calculated when $\Delta s$ is greater than a maximum value of the predetermined change range, wherein $\Delta t$ is a predetermined correction value. For example, the predetermined change range is [−5,5], the predetermined correction value $\Delta t$ is 0.00005 s. When $\Delta s$ is =−7, that is, $\Delta s$ is smaller than the minimum value of the predetermined change range, the second zero crossing point interval $T2=T1-\Delta t=0.00975$ s−0.00005 s=0.0097 s. When $\Delta s=14$, that is, $\Delta s$ is greater than the maximum value of the predetermined change range, the second zero crossing point interval $T2=T1+\Delta t=0.0098$ s. In the optional implementation, the zero crossing point signal output interval is corrected by setting the predetermined correction value $\Delta t$ instead of directly setting the zero crossing point signal output interval based on the sampling numbers of the zero crossing point square wave signals, thereby avoiding an inaccurate zero crossing point signal output interval, which results from great fluctuation and large error in the output zero crossing point square wave signals of the zero-crossing detection circuit due to its components being affected by environmental changes and the like.

At S105, zero crossing point signals with an interval being the zero crossing point signal output interval are continuously output.

In the embodiment, when the zero crossing point output interval is T1, zero crossing point signals having an interval of 0.00975 s are continuously output, and when the zero crossing point output interval is T2, zero crossing point signals having an interval of 0.0098 s are continuously output. The mode of outputting the zero crossing point signals may be the same as that at S103. By adjusting the zero crossing point signal output interval according to the sampling numbers of the input zero crossing point square wave signals, the accuracy of outputting the zero crossing point signals can be improved, and the communication efficiency can be improved.

According to the technical solution of the present disclosure, the embodiment provides a zero crossing point signal output method. After receiving zero crossing point square wave signals input by a zero-crossing detection circuit, an average sampling number is obtained by calculating a sampling number of each zero crossing point square wave signal in $1^{st}$ to $M^{th}$ zero crossing point square wave signals, a zero crossing point signal output interval is obtained based on the average sampling number and a predetermined sampling frequency, zero crossing point signals are output based on the zero crossing point signal output interval, sampling numbers of subsequent zero crossing point square wave signals are continuously calculated, the zero crossing point signal output interval is adjusted based on the subsequent zero crossing point square wave signals, the zero crossing point signals are output based on the adjusted result. By using the zero crossing point signal output method to correct a detection result of the zero-crossing detection circuit and output the zero crossing point signals, the zero crossing point signals output according to the method have small errors, and when such zero crossing point signals are used to conduct power line communications, the problem of low zero crossing point communication efficiency due to a large error in the detection result of the zero-crossing detection circuit is avoided, and the communication efficiency is improved.

Embodiment 2

The present embodiment provides a computer-readable storage medium including computer instructions. The computer instructions, when executed, implement the zero crossing point signal output method in Embodiment 1. For specific operations, reference may be made to Embodiment 1, which is not described herein again.

Embodiment 3

Figure 5:
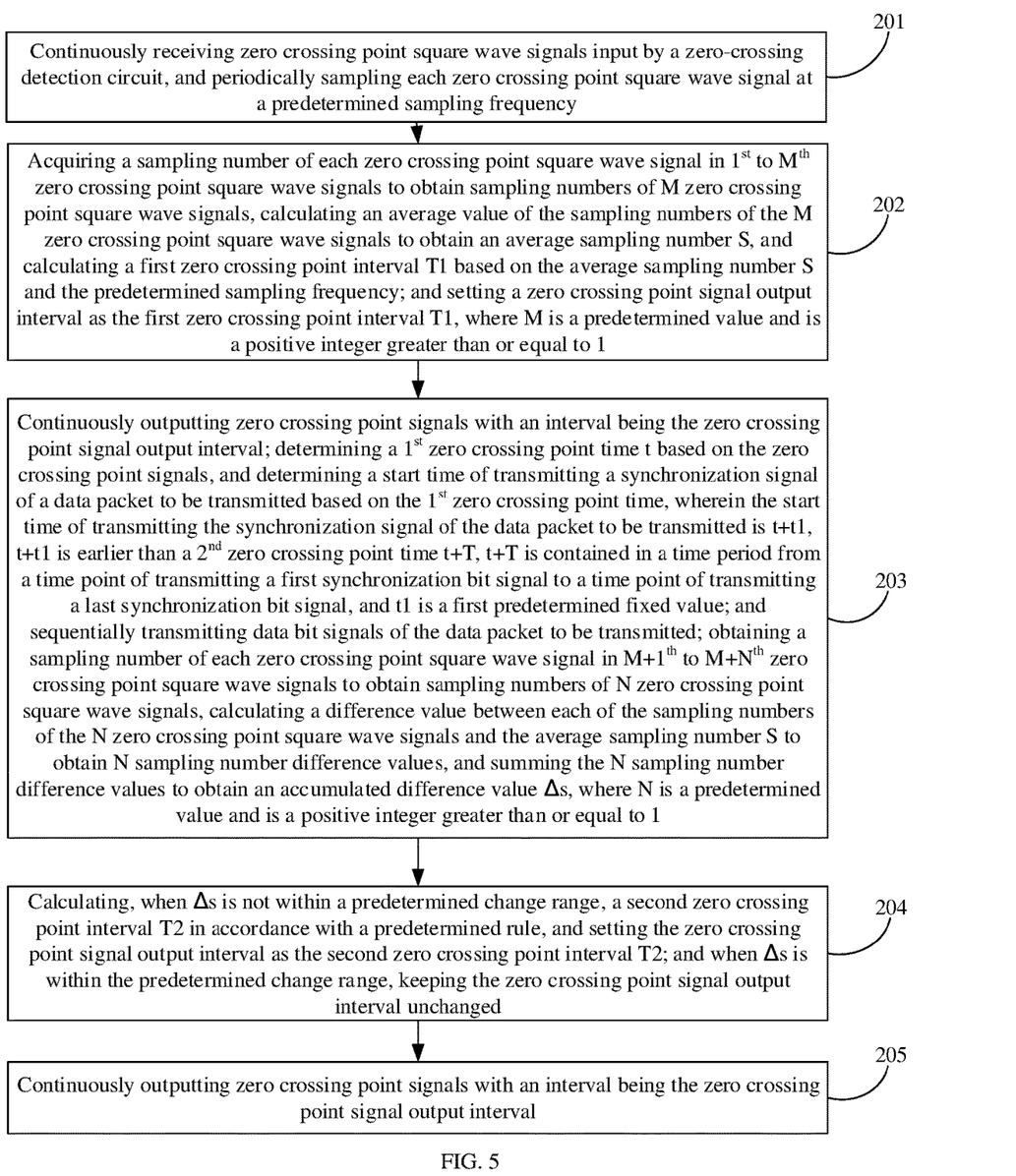
FIG. 5 is a flowchart of a power line data transmitting method according to Embodiment 3 of the present disclosure.

As illustrated in FIG. 5, the embodiment provides a power line data transmitting method, which includes the zero crossing point signal output method in Embodiment 1. Therefore, specific implementations and optional implementations of S201, S202, S204, and S205 are the same as those of S101, S102, S104, and S105 in Embodiment 1, and the same parts as those in Embodiment 1 are not repeated and only different parts are described in detail.

At S201, zero crossing point square wave signals input by a zero-crossing detection circuit are continuously received, and each zero crossing point square wave signal is periodically sampled at a predetermined sampling frequency.

At S202, a sampling number of each zero crossing point square wave signal in $1^{st}$ to $M^{th}$ zero crossing point square wave signals is acquired to obtain sampling numbers of M zero crossing point square wave signals, an average value of the sampling numbers of the M zero crossing point square wave signals is calculated to obtain an average sampling number S, and a first zero crossing point interval T1 is calculated based on the average sampling number S and the predetermined sampling frequency; and a zero crossing point signal output interval is set as the first zero crossing point interval T1, where M is a predetermined value and is a positive integer greater than or equal to 1.

At S203, zero crossing point signals with an interval being the zero crossing point signal output interval are continuously output; a $1^{st}$ zero crossing point time t is determined based on the zero crossing point signals, and a start time of transmitting a synchronization signal of a data packet to be transmitted is determined based on the $1^{st}$ zero crossing point time, where the start time of transmitting the synchronization signal of the data packet to be transmitted is $t+t_1$, $t+t_1$ is earlier than a $2^{nd}$ zero crossing point time $t+T$, $t+T$ is contained in a time period from a time point of transmitting a first synchronization bit signal to a time point of transmitting a last synchronization bit signal, and $t_1$ is a first predetermined fixed value; and data bit signals of the data packet to be transmitted are sequentially transmitted; a sampling number of each zero crossing point square wave signal in $M+1^{th}$ to $M+N^{th}$ zero crossing point square wave signals is obtained to obtain sampling numbers of N zero crossing point square wave signals, a difference value between each of the sampling numbers of the N zero crossing point square wave signals and the average sampling number S is calculated to obtain N sampling number difference values, and the N sampling number difference values are summed to obtain an accumulated difference value Δs, where N is a predetermined value and is a positive integer greater than or equal to 1.

In the embodiment, after continuously outputting zero crossing point signals with an interval being the zero crossing point signal output interval, the $1^{st}$ zero crossing point time is determined based on the zero crossing point signals, and the start time of the synchronization signal of the data packet to be transmitted is determined based on the $1^{st}$ zero crossing point time, where the start time is earlier than the $2^{nd}$ zero crossing point time, so that the time period for transmitting the synchronization signal of the data packet to be transmitted contains the $2^{nd}$ zero crossing point time. After the transmission of the synchronization signal is finished, the data bit signals of the data packet to be transmitted are sequentially transmitted. Since the time period for transmitting the synchronization signal of the data packet to be transmitted contains the zero crossing point time, near which there is less interference, the efficiency of signal transmission is higher. This also facilitates a signal receiving end to determine whether received signals are near a zero crossing point and determine whether the signals are the synchronization signal, so that information can be transmitted efficiently and completely.

At S204, when Δs is not within a predetermined change range, a second zero crossing point interval T2 is calculated in accordance with a predetermined rule, and the zero crossing point signal output interval is set as the second zero crossing point interval T2; and when Δs is within the predetermined change range, the zero crossing point signal output interval is kept unchanged.

At S205, zero crossing point signals with an interval being the zero crossing point signal output interval are continuously output.

According to the technical solutions provided by the present disclosure, the present disclosure provides a power line data transmitting method. After receiving zero crossing point square wave signals input by the zero-crossing detection circuit, the average sampling number is obtained by calculating the sampling number of each zero crossing point square wave signal in $1^{st}$ to $M^{th}$ zero crossing point square wave signals, the zero crossing point signal output interval is obtained based on the average sampling number and the predetermined sampling frequency, the zero crossing point signals are output based on the zero crossing point signal output interval, a zero crossing point time is determined based on the zero crossing point signals, the start time of transmitting the synchronization signal of the data packet to be transmitted is determined, such that the zero crossing point time is contained in the time period during which the synchronization signal is transmitted, sampling numbers of subsequent zero crossing point square wave signals are continuously calculated, the zero crossing point signal output interval is adjusted based on the subsequent zero crossing point square wave signals, and the zero crossing point signals are output based on the adjusted result. By using the power line data transmitting method as described above to correct a detection result of the zero-crossing detection circuit and output the zero crossing point signals, when the zero crossing point signals output according to the method are used to conduct power line communications, the problem of low zero crossing point communication efficiency due to a large error in the detection result of the zero-crossing detection circuit is avoided, and the communication efficiency is improved. Meanwhile, the zero crossing point signal is contained in the time period for transmitting the synchronization signal of the data packet to be transmitted, so that a receiving end can determine whether received signals are near a zero crossing point and determine whether the signals are the synchronization signal, and thus information can be transmitted efficiently and completely.

Embodiment 4

The present embodiment provides a computer-readable storage medium including computer instructions. The computer instructions, when executed, implement the power line data transmitting method in Embodiment 3. For specific operations, reference may be made to Embodiment 3, which is not described herein again.

Embodiment 5

In the embodiment, a zero crossing point signal output apparatus is provided. The apparatus corresponds to the zero crossing point signal output method in Embodiment 1, and thus details thereof are not repeated herein and only a brief description is provided. In an optional implementation of the embodiment, for specific operations performed by each unit in the zero crossing point signal output apparatus, reference may be made to Embodiment 1.

In the embodiment, the zero crossing point signal output apparatus may be included in any communication terminal in power line communications, for example, a camera, a Personal Computer (PC), a server, or the like, or may be an independent device.

Figure 6:
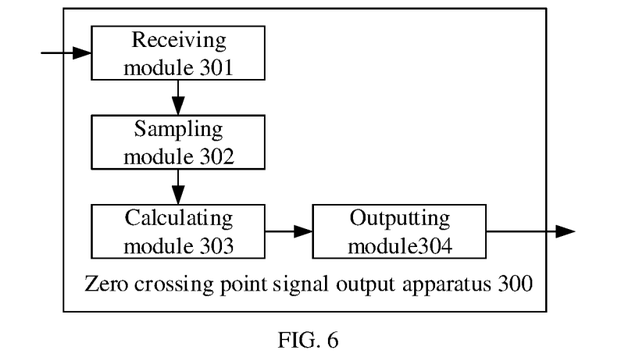
FIG. 6 is a schematic diagram of a structure of a zero crossing point signal output apparatus according to Embodiment 5 of the present disclosure.

FIG. 6 illustrates an optional zero crossing point signal output apparatus 300 of the present embodiment, including: a receiving module 301, a sampling module 302, a calculating module 303 and an outputting module 304.

The receiving module 301 is configured to continuously receive zero crossing point square wave signals input by a zero-crossing detection circuit.

The sampling module 302 is configured to periodically sample each zero crossing point square wave signal at a predetermined sampling frequency.

The calculating module 303 is configured to acquire a sampling number of each zero crossing point square wave signal in $1^{st}$ to $M^{th}$ zero crossing point square wave signals to obtain sampling numbers of M zero crossing point square wave signals, calculate an average value of the sampling numbers of the M zero crossing point square wave signals to obtain an average sampling number S, and calculate a first zero crossing point interval T1 based on the average sampling number S and the predetermined sampling frequency; and set a zero crossing point signal output interval as the first zero crossing point interval T1, wherein M is a predetermined value and is a positive integer greater than or equal to 1.

The outputting module 304 is configured to continuously output zero crossing point signals with an interval being the zero crossing point signal output interval.

The calculating module 303 is further configured to obtain a sampling number of each zero crossing point square wave signal in $M+1^{th}$ to $M+N^{th}$ zero crossing point square wave signals to obtain sampling numbers of N zero crossing point square wave signals, calculate a difference value between each of the sampling numbers of the N zero crossing point square wave signals and the average sampling number S to obtain N sampling number difference values, and sum the N sampling number difference values to obtain an accumulated difference value Δs, where N is a predetermined value and is a positive integer greater than or equal to 1; calculate, when Δs is not within a predetermined change range, a second zero crossing point interval T2 in accordance with a predetermined rule, and set the zero crossing point signal output interval as the second zero crossing point interval T2; and when Δs is within the predetermined change range, keep the zero crossing point signal output interval unchanged.

As a preferred implementation of the embodiment, the zero crossing point signal output apparatus 300 of the embodiment further includes a filtering module (not shown). The filtering module is configured to, subsequent to the receiving module continuously receiving the zero crossing point square wave signals input by the zero-crossing detection circuit, perform filtering on each of the received zero crossing point square wave signals to filter out high-frequency noise in each zero crossing point square wave signal. In the optional implementation, the zero crossing point square wave signals are periodically sampled after using the filtering module to filter the high-frequency noise out, so that misjudgment of the zero crossing point square wave signals caused by the existence of the high-frequency noise and hence incorrect sampling results due to the misjudgment are avoided.

As a preferred implementation of the embodiment, the calculating module 303 being configured to calculate, when Δs is not within the predetermined change range, the second zero crossing point interval T2 in accordance with the predetermined rule includes: the calculating module 303 being configured to calculate T2=T1−Δt when Δs is smaller than a minimum value of the predetermined change range, and calculate T2=T1+Δt when Δs is greater than a maximum value of the predetermined change range, wherein Δt is a predetermined correction value. For example, the predetermined change range is [−5,5], the predetermined correction value Δt is 0.00005 s; when Δs=−7, that is, Δs is smaller than the minimum value of the predetermined change range, the second zero crossing point interval T2=T1−Δt=0.00975 s−0.00005 s=0.0097 s; and when Δs=14, that is, Δs is greater than the maximum value of the predetermined change range, the second zero crossing point interval T2=T1+Δt=0.0098 s. In the optional implementation, the zero crossing point signal output interval is corrected by setting the predetermined correction value Δt instead of directly setting the zero crossing point signal output interval based on the sampling numbers of the zero crossing point square wave signals, thereby avoiding an inaccurate zero crossing point signal output interval, which results from great fluctuation and large error in the output zero crossing point square wave signals of the zero-crossing detection circuit due to its components being affected by environmental changes and the like.

According to the technical solutions provided by the present disclosure, the present embodiment provides a zero crossing point signal output apparatus 300. After the receiving module 301 receives the zero crossing point square wave signals input by the zero-crossing detection circuit, the sampling module 302 periodically samples the zero crossing point square wave signals, the calculating module 303 obtains an average sampling number by calculating the sampling number of each zero crossing point square wave signal in the $1^{st}$ to $M^{th}$ zero crossing point square wave signals, and obtains a zero crossing point signal output interval based on the average sampling number and a predetermined sampling frequency, the outputting module 304 outputs zero crossing point signals based on the zero crossing point signal output interval, the calculating module 303 continuously calculates sampling numbers of subsequent zero crossing point square wave signals, the zero crossing point signal output interval is adjusted based on the subsequent zero crossing point square wave signals, and the outputting module 304 outputs the zero crossing point signals based on the adjusted result. By using the apparatus to correct the detection result of the zero-crossing detection circuit and output the zero crossing point signals, the zero crossing point signals output by the apparatus have small errors, and when such zero crossing point signals are used for conducting power line communications, the problem of low zero crossing point communication efficiency caused by a large error in the detection result of the zero-crossing detection circuit is avoided, and the communication efficiency is improved.

Embodiment 6

The embodiment provides a power line data transmitting device, which includes the zero crossing point signal output apparatus 300 in Embodiment 5. The device corresponds to the power line data transmitting method in Embodiment 3, and thus details of the same parts are not repeated herein and only a brief description is provided. In an optional implementation of the embodiment, for the specific operations performed by each unit in the power line data transmitting device, reference may be made to Embodiments 3 and 5.

In the embodiment, the power line data transmitting device may be any communication terminal in power line communications, for example, a camera, a PC, a server, etc., and may also be included in another terminal device.

Figure 7:
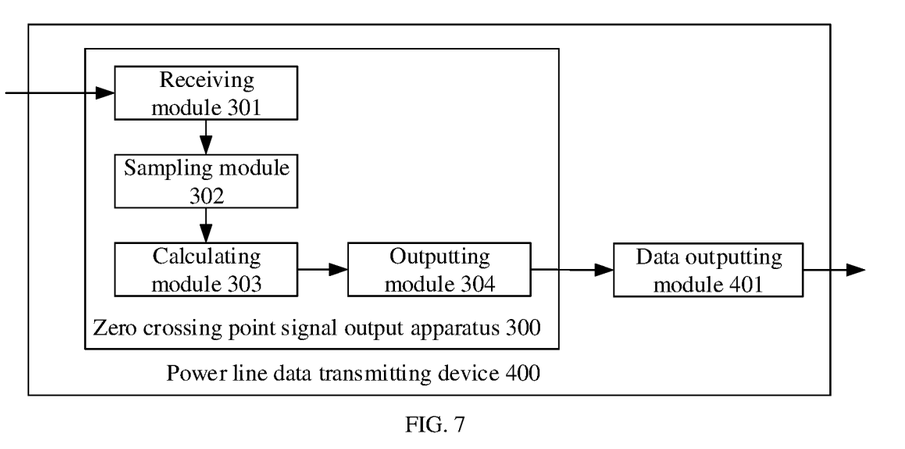
FIG. 7 is a schematic diagram of a structure of a power line data transmitting device according to Embodiment 6 of the present disclosure.

FIG. 7 is an optional power line data transmitting device 400 of the embodiment, which includes the zero crossing point signal output apparatus 300 disclosed in Embodiment 5, and a data outputting module 401.

The data outputting module 401 is configured to, subsequent to receiving the zero crossing point signals with the interval being the zero crossing point signal output interval which are continuously output by the outputting module 304, determine a 1st zero crossing point time t based on the zero crossing point signals, and determine a start time of transmitting a synchronization signal of a data packet to be transmitted based on the 1st zero crossing point time, wherein the start time of transmitting the synchronization signal of the data packet to be transmitted is $t+t_1$, $t+t_1$ is earlier than a 2nd zero crossing point time $t+T$, $t+T$ is included in a time period from a time point of transmitting a first synchronization bit signal to a time point of transmitting a last synchronization bit signal, and t1 is a first predetermined fixed value; and sequentially transmit data bit signals of the data packet to be transmitted.

According to the above technical solutions provided by the present disclosure, the embodiment provides a power line data transmitting device 400, which includes the zero crossing point signal output apparatus 300 in Embodiment 5. After the receiving module 301 receives zero crossing point square wave signals input by the zero-crossing detection circuit, the sampling module 302 periodically samples the zero crossing point square wave signals, the calculating module 303 obtains an average sampling number by calculating the sampling number of each zero crossing point square wave signal from the $1^{st}$ to the $M^{th}$ zero crossing point square wave signal, and obtains a zero crossing point signal output interval based on the average sampling number and a predetermined sampling frequency, the outputting module 304 outputs zero crossing point signals based on the zero crossing point signal output interval, the data outputting module 401 determines a zero crossing point time based on the zero crossing point signals, and determines a start time of transmitting a synchronization signal of a data packet to be transmitted, so that the zero crossing point time is contained in a time period for transmitting the synchronization signal, the calculating module 303 continuously calculates the sampling numbers of the subsequent zero crossing point square wave signals, and adjusts the zero crossing point signal output interval based on the subsequent zero crossing point square wave signals, and the outputting module 304 outputs the zero crossing point signals based on the adjusted result. By using the device to correct the detection result of the zero-crossing detection circuit and output the zero crossing point signals, when the zero crossing point signals output by the device are used to conduct power line communications, the problem of low zero crossing point communication efficiency caused by a large error in the detection result of the zero-crossing detection circuit is avoided, and the communication efficiency is improved. Meanwhile, the zero crossing point signal is contained in the time period for transmitting the synchronization signal of the data packet to be transmitted, so that a receiving end can determine whether received signals are near a zero crossing point and determine whether the signals are the synchronization signal, and thus information can be transmitted efficiently and completely.

Although explanatory embodiments have been shown and described, it would be appreciated by those skilled in the art that the above embodiments cannot be construed to limit the present disclosure, and changes, alternatives, and modifications can be made to the embodiments within the scope of the present disclosure by those skilled in the art, without departing from the principle and purpose of the present disclosure. The scope of the present disclosure is defined by the appended claims and equivalents thereof.

What is claimed is:

1. A zero crossing point signal output method, comprising:

continuously receiving zero crossing point square wave signals input by a zero-crossing detection circuit, and periodically sampling each zero crossing point square wave signal at a predetermined sampling frequency;

acquiring a sampling number of each zero crossing point square wave signal in $1^{st}$ to $M^{th}$ zero crossing point square wave signals to obtain sampling numbers of M zero crossing point square wave signals, calculating an average value of the sampling numbers of the M zero crossing point square wave signals to obtain an average sampling number S, and calculating a first zero crossing point interval T1 based on the average sampling number S and the predetermined sampling frequency;

and setting a zero crossing point signal output interval as the first zero crossing point interval T1, where M is a predetermined value and is a positive integer greater than or equal to 1;

continuously outputting zero crossing point signals with an interval being the zero crossing point signal output interval; obtaining a sampling number of each zero crossing point square wave signal in $M+1^{th}$ to $M+N^{th}$ zero crossing point square wave signals to obtain sampling numbers of N zero crossing point square wave signals, calculating a difference value between each of the sampling numbers of the N zero crossing point square wave signals and the average sampling number S to obtain N sampling number difference values, and summing the N sampling number difference values to obtain an accumulated difference value Δs, where N is a predetermined value and is a positive integer greater than or equal to 1;

calculating, when Δs is not within a predetermined change range, a second zero crossing point interval T2 in accordance with a predetermined rule, and setting the zero crossing point signal output interval as the second zero crossing point interval T2; and when Δs is within the predetermined change range, keeping the zero crossing point signal output interval unchanged; and continuously outputting zero crossing point signals with an interval being the zero crossing point signal output interval.

2. The method according to claim 1, wherein said continuously receiving the zero crossing point square wave signals input by the zero-crossing detection circuit, and periodically sampling each zero crossing point square wave signal at the predetermined sampling frequency comprises:

continuously receiving the zero crossing point square wave signals input by the zero-crossing detection circuit, performing filtering on each of the received zero crossing point square wave signals to filter out high-frequency noise in each zero crossing point square wave signal, and periodically sampling each zero crossing point square wave signal at the predetermined sampling frequency.

3. The method according to claim 1, wherein said calculating, when Δs is not within the predetermined change range, the second zero crossing point interval T2 in accordance with the predetermined rule comprises:

calculating T2=T1−Δt when Δs is smaller than a minimum value of the predetermined change range, and calculating T2=T1+Δt when Δs is greater than a maximum value of the predetermined change range, wherein Δt is a predetermined correction value.

4. A computer readable storage medium, comprising computer instructions, wherein the computer instructions, when executed, implement the zero crossing point signal output method according to claim 1.

5. A power line data transmitting method, comprising the zero crossing point signal output method according to claim 1, and further comprising: subsequent to said continuously outputting the zero crossing point signals with the interval being the zero crossing point signal output interval T, determining a $1^{st}$ zero crossing point time t based on the zero crossing point signals, and determining a start time of transmitting a synchronization signal of a data packet to be transmitted based on the $1^{st}$ zero crossing point time, wherein the start time of transmitting the synchronization signal of the data packet to be transmitted is t+t1, t+t1 is earlier than a $2^{nd}$ zero crossing point time t+T, t+T is contained in a time period from a time point of transmitting a first synchronization bit signal to a time point of transmitting a last synchronization bit signal, and t1 is a first predetermined fixed value; and sequentially transmitting data bit signals of the data packet to be transmitted.

6. A computer readable storage medium comprising computer instructions, wherein the computer instructions, when executed, implement the power line data transmitting method according to claim 5.

7. A zero crossing point signal output apparatus, comprising:

a receiving module configured to continuously receive zero crossing point square wave signals input by a zero-crossing detection circuit;

a sampling module configured to periodically sample each zero crossing point square wave signal at a predetermined sampling frequency;

a calculating module configured to acquire a sampling number of each zero crossing point square wave signal in $1^{st}$ to $M^{th}$ zero crossing point square wave signals to obtain sampling numbers of M zero crossing point square wave signals, calculate an average value of the sampling numbers of the M zero crossing point square wave signals to obtain an average sampling number S, and calculate a first zero crossing point interval T1 based on the average sampling number S and the predetermined sampling frequency; and set a zero crossing point signal output interval as the first zero crossing point interval T1, wherein M is a predetermined value and is a positive integer greater than or equal to 1; and an outputting module configured to continuously output zero crossing point signals with an interval being the zero crossing point signal output interval, wherein the calculating module is further configured to obtain a sampling number of each zero crossing point square wave signal in $M+1^{th}$ to $M+N^{th}$ zero crossing point square wave signals to obtain sampling numbers of N zero crossing point square wave signals, calculate a difference value between each of the sampling numbers of the N zero crossing point square wave signals and the average sampling number S to obtain N sampling number difference values, and sum the N sampling number difference values to obtain an accumulated difference value Δs, where N is a predetermined value and is a positive integer greater than or equal to 1; calculate, when Δs is not within a predetermined change range, a second zero crossing point interval T2 in accordance with a predetermined rule, and set the zero crossing point signal output interval as the second zero crossing point interval T2; and when Δs is within the predetermined change range, keep the zero crossing point signal output interval unchanged.

8. The zero crossing point signal output apparatus according to claim 7, further comprising:

a filtering module configured to, subsequent to the receiving module continuously receiving the zero crossing point square wave signals input by the zero-crossing detection circuit, perform filtering on each of the received zero crossing point square wave signals to filter out high-frequency noise in each zero crossing point square wave signal.

9. The zero crossing point signal output apparatus according to claim 7, wherein the calculating module being configured to calculate, when Δs is not within the predetermined change range, the second zero crossing point interval T2 in accordance with the predetermined rule comprises:

the calculating module being configured to calculate $T2=T1-\Delta t$ when $\Delta s$ is smaller than a minimum value of the predetermined change range, and calculate $T2=T1+\Delta t$ when $\Delta s$ is greater than a maximum value of the predetermined change range, wherein $\Delta t$ is a predetermined correction value.

10. A power line data transmitting device, comprising:

the zero crossing point signal output apparatus of claim 7; and a data outputting module configured to, subsequent to receiving the zero crossing point signals with the interval being the zero crossing point signal output interval which are continuously output by the outputting module, determine a 1st zero crossing point time t based on the zero crossing point signals, and determine a start time of transmitting a synchronization signal of a data packet to be transmitted based on the 1st zero crossing point time, wherein the start time of transmitting the synchronization signal of the data packet to be transmitted is t+t1, t+t1 is earlier than a 2nd zero crossing point time t+T, t+T is comprised in a time period from a time point of transmitting a first synchronization bit signal to a time point of transmitting a last synchronization bit signal, and t1 is a first predetermined fixed value; and sequentially transmit data bit signals of the data packet to be transmitted.

* * * * *